US012615903B2

(12) United States Patent
Bonucci

(10) Patent No.: US 12,615,903 B2
(45) Date of Patent: Apr. 28, 2026

(54) LED ASSEMBLY

(71) Applicant: TE CONNECTIVITY BRASIL INDUSTRIA DE ELECTRONICOS LTDA, Braganca Paulista (BR)

(72) Inventor: Gustavo Bonucci, Sao Paulo (BR)

(73) Assignee: TE CONNECTIVITY BRASIL INDUSTRIA DE ELECTRONICOS LTDA, Braganca Paulista (BR)

( * ) Notice: Subject to any disclaimer, the term of this patent is extended or adjusted under 35 U.S.C. 154(b) by 499 days.

(21) Appl. No.: 18/179,465

(22) Filed: Mar. 7, 2023

(65) Prior Publication Data

US 2024/0304654 A1 Sep. 12, 2024

(51) Int. Cl.
| | |
|---|---|
| *H10H 29/14* | (2025.01) |
| *H01R 13/04* | (2006.01) |
| *H01R 13/516* | (2006.01) |
| *H01R 13/627* | (2006.01) |

(52) U.S. Cl.
CPC ........... *H10H 29/142* (2025.01); *H01R 13/04* (2013.01); *H01R 13/516* (2013.01); *H01R 13/6271* (2013.01)

(58) Field of Classification Search
None
See application file for complete search history.

(56) References Cited

U.S. PATENT DOCUMENTS

| | | | | |
|---|---|---|---|---|
| 8,206,159 B2 * | 6/2012 | Naito | ................. | H01R 12/7082 439/65 |
| 8,678,849 B2 * | 3/2014 | Yang | ...................... | H01R 24/68 439/374 |

* cited by examiner

*Primary Examiner* — Ross N Gushi
(74) *Attorney, Agent, or Firm* — Jay J. Hoette; Carroll, Hoette & Butscher, LLC

(57) ABSTRACT

An LED assembly includes a receptacle connector mounted to a first end of an LED board and a plug connector mounted to a second end of the LED board. The receptacle connector includes a receptacle housing holding receptacle contacts configured to be mated with mating plug contacts of a mating plug connector on another LED board. The receptacle housing includes contact slots having top openings at the top and front openings at the front configured to receive the mating plug contacts. The plug connector includes a plug housing holding plug contacts configured to be mated with mating receptacle contacts of a mating receptacle connector on another LED board. The plug contacts have mating ends configured to be plugged into the mating receptacle contacts of the mating receptacle connector.

20 Claims, 9 Drawing Sheets

LED ASSEMBLY

BACKGROUND OF THE INVENTION

The subject matter herein relates generally to lighting systems.

Some known lighting systems include LED assemblies to provide lighting. The LED assemblies have LED elements that are arranged on LED boards. Some known LED boards form long strips of LED elements. However, different applications require different length LED strips. Providing many different LED boards having different lengths requires a large inventory, which may be expensive to maintain. Other lighting systems use smaller LED boards that can be ganged together in a longer strip. However, supplying power to each of the LED boards can be difficult increases cost of the system.

A need remains for a cost effective and reliable method of connecting LED boards in a lighting system.

BRIEF DESCRIPTION OF THE INVENTION

In one embodiment, an LED assembly is provided and includes an LED board extending between a front end and a rear end. The LED board has an LED element on the LED board. The LED assembly includes a receptacle connector mounted to the LED board at the front end. The receptacle connector includes a receptacle housing holding receptacle contacts configured to be mated with mating plug contacts of a mating plug connector on another LED board. The receptacle housing has a bottom mounted to the LED board and a top opposite the bottom. The receptacle housing has a front and a rear opposite the front. The receptacle housing has a first side and a second side. The receptacle housing has receptacle contact channels therethrough that receive the corresponding receptacle contacts. The receptacle housing includes contact slots associated with each of the receptacle contact channels. The contact slots have top openings at the top. The contact slots have front openings at the front. The top openings are configured to receive the mating plug contacts from above during mating to mate with the receptacle contacts. The front openings allow the mating plug contacts to extend from the front of the receptacle housing. The LED assembly includes a plug connector mounted to the LED board at the rear end. The plug connector includes a plug housing holding plug contacts configured to be mated with mating receptacle contacts of a mating receptacle connector on another LED board. The plug housing has a bottom mounted to the LED board and a top opposite the bottom. The plug housing has a front and a rear opposite the front. The plug housing has a first side and a second side. The plug housing has plug contact channels therethrough that receive the corresponding plug contacts. The plug housing includes an end wall. The plug contacts have mating ends extending forward of the end wall. The mating ends configured to be plugged into the mating receptacle contacts of the mating receptacle connector.

In another embodiment, a lighting system is provided and includes a plurality of LED assemblies electrically connected in series. Each LED assembly includes an LED board extending between a front end and a rear end. The LED board has an LED element on the LED board. The LED assembly includes a receptacle connector mounted to the LED board at the front end. The receptacle connector includes a receptacle housing holding receptacle contacts. The receptacle housing has a bottom mounted to the LED board and a top opposite the bottom. The receptacle housing has a front and a rear opposite the front. The receptacle housing has a first side and a second side. The receptacle housing has receptacle contact channels therethrough that receive the corresponding receptacle contacts. The receptacle housing includes contact slots associated with each of the receptacle contact channels. The contact slots have top openings at the top. The contact slots have front openings at the front. The LED assembly includes a plug connector mounted to the LED board at the rear end. The plug connector includes a plug housing holding plug contacts. The plug housing has a bottom mounted to the LED board and a top opposite the bottom. The plug housing has a front and a rear opposite the front. The plug housing has a first side and a second side. The plug housing has plug contact channels therethrough that receive the corresponding plug contacts. The plug housing includes an end wall. The plug contacts have mating ends extending forward of the end wall. The plurality of LED assemblies include a first LED assembly, a second LED assembly, and a third LED assembly. The second LED assembly is positioned between the first LED assembly and the second LED assembly. The plug connector of the first LED assembly is coupled to the receptacle connector of the second LED assembly by loading the mating ends of the plug contacts of the first LED assembly into the top openings of the receptacle housing of the second LED assembly to mate with the receptacle contacts of the second LED assembly, when mated, the plug contacts extend from the end wall of the plug housing of the first LED assembly into the front openings of the receptacle housing of the second LED assembly to electrically connect with the receptacle contacts of the second LED assembly. The plug connector of the second LED assembly is coupled to the receptacle connector of the third LED assembly by loading the mating ends of the plug contacts of the second LED assembly into the top openings of the receptacle housing of the third LED assembly to mate with the receptacle contacts of the third LED assembly, when mated, the plug contacts extend from the end wall of the plug housing of the second LED assembly into the front openings of the receptacle housing of the third LED assembly to electrically connect with the receptacle contacts of the third LED assembly

DETAILED DESCRIPTION OF THE INVENTION

Figure 1:
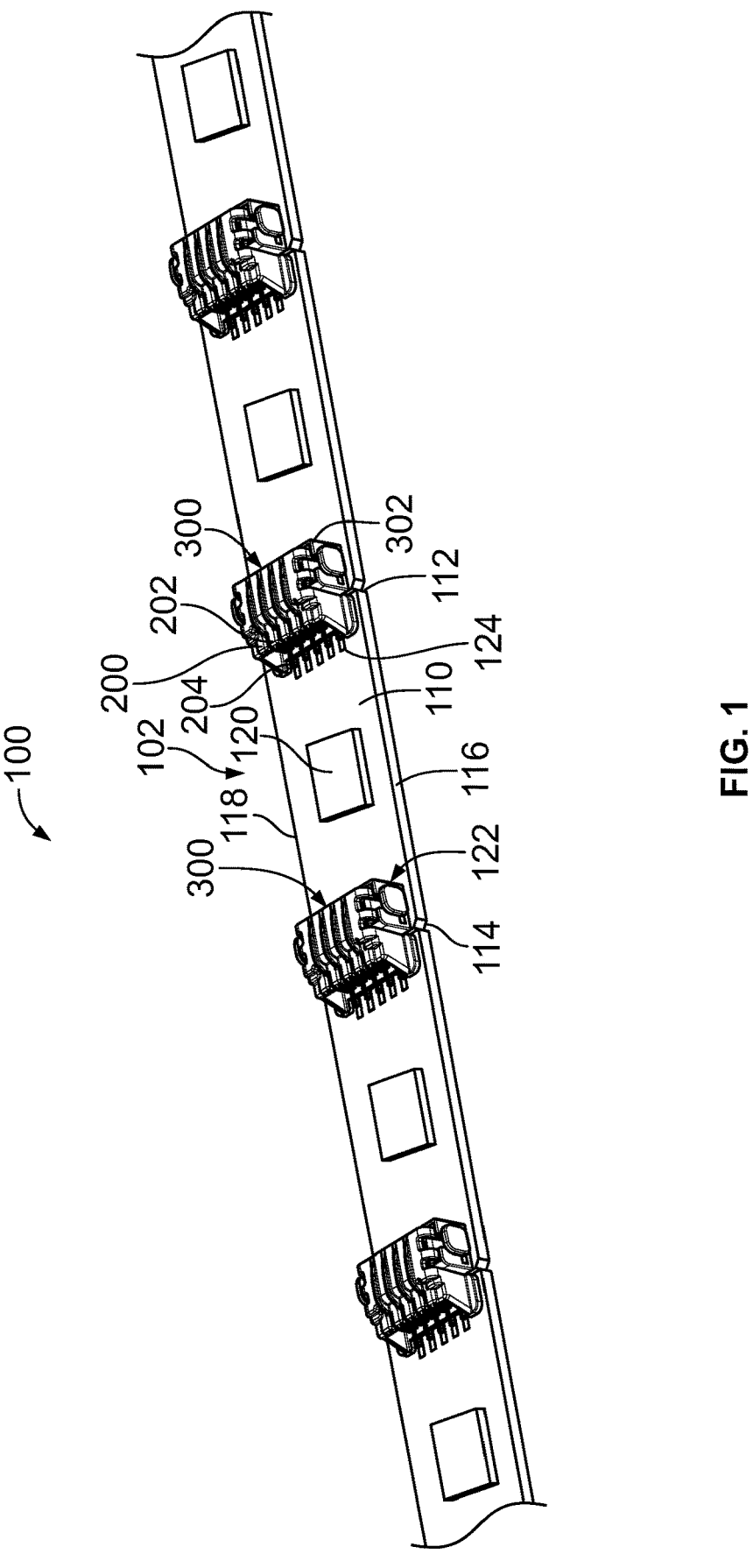
FIG. 1 is a perspective view of a lighting system in accordance with an exemplary embodiment showing a plurality of LED assemblies electrically connected in series.

FIG. 1 is a perspective view of a lighting system 100 in accordance with an exemplary embodiment showing a plurality of LED assemblies 102 electrically connected in series. The LED assemblies 102 are ganged together to provide power from an upstream LED assembly 102 downstream to the other LED assemblies 102. The LED assemblies 102 are easily and quickly connected together. The electrical connections between the LED assemblies 102 are safe, such as to prevent inadvertent touching or damage to the components of the LED assemblies 102. The lighting system 100 is designed to transfer power from LED assembly 102 to LED assembly 102 in an efficient manner.

In the illustrated embodiment, the LED assemblies 102 include a first LED assembly 102a, a second LED assembly 102b, and a third LED assembly 102c. The second LED assembly 102b is located between the first and third LED assemblies 102a, 102c. Additionally LED assemblies 102 may be provided upstream of the first LED assembly 102a and/or downstream of the third LED assembly 102c. Greater or fewer LED assemblies 102 may be provided in alternative embodiments. Optionally, the LED assemblies 102 are identical to each other including the same components. The components are described below, generally without reference to the "first", "second" or "third" LED assemblies, but the various components may be referenced herein, including in the claims, specifically with identifiers such as "first", "second" and "third" to identify inclusion in such "first", "second" or "third" LED assemblies.

Each LED assembly 102 includes an LED board 110, a plug connector 200, and a receptacle connector 300. The plug connector 200 of each LED assembly 102 is coupled to the receptacle connector 300 of the adjacent or downstream LED assembly 102 to transfer power from upstream LED assembly 102 to downstream LED assembly 102. The LED boards 110 are arranged end to end in a strip. The plug connectors 200 and the receptacle connectors 300 are mated across the threshold between the corresponding LED boards 110.

Each LED board 110 extends between a front end 112 and a rear end 114. The LED board 110 has sides 116, 118 between the front and rear ends 112, 114. Each LED board 110 includes one or more LED elements 120 on the surface of the LED board 110. The LED board 110 may include a driver or other component for controlling the LED element 120. In the illustrated embodiment, the LED element 120 is provided on the same side of the LED board 110 as the connectors 200, 300. However, in alternative embodiments, the LED element 120 may additionally or alternatively be provided on the opposite sides of the LED board 110 from the connectors 200, 300.

The plug connector 200 is mounted to the LED board 110, such as at the downstream or rear end 114 of the LED board 110. In an exemplary embodiment, the plug connector 200 includes a plug housing 202 holding a plurality of plug contacts 204. In various embodiments, the plug contacts 204 are surface mounted to the LED board 110. For example, the plug contacts 204 may be soldered to contact pads 122 on the LED board 110. In alternative embodiments, the plug contacts 204 may be press-fit into plated vias of the LED board 110. In various embodiments, the plug housing 202 is press-fit onto the LED board 110. However, in alternative embodiments, the plug housing 202 may be secured to the LED board 110 using solder tabs, clips, fasteners, or other securing means.

The receptacle connector 300 is mounted to the LED board 110, such as at the upstream or front end 112 of the LED board 110. In an exemplary embodiment, the receptacle connector 300 includes a receptacle housing 302 holding a plurality of receptacle contacts 304. In various embodiments, the receptacle contacts 304 are surface mounted to the LED board 110. For example, the receptacle contacts 304 may be soldered to contact pads 124 on the LED board 110. In alternative embodiments, the receptacle contacts 304 may be press-fit into plated vias of the LED board 110. In various embodiments, the receptacle housing 302 is press-fit onto the LED board 110. However, in alternative embodiments, the receptacle housing 302 may be secured to the LED board 110 using solder tabs, clips, fasteners, or other securing means.

Figures 2, 3:
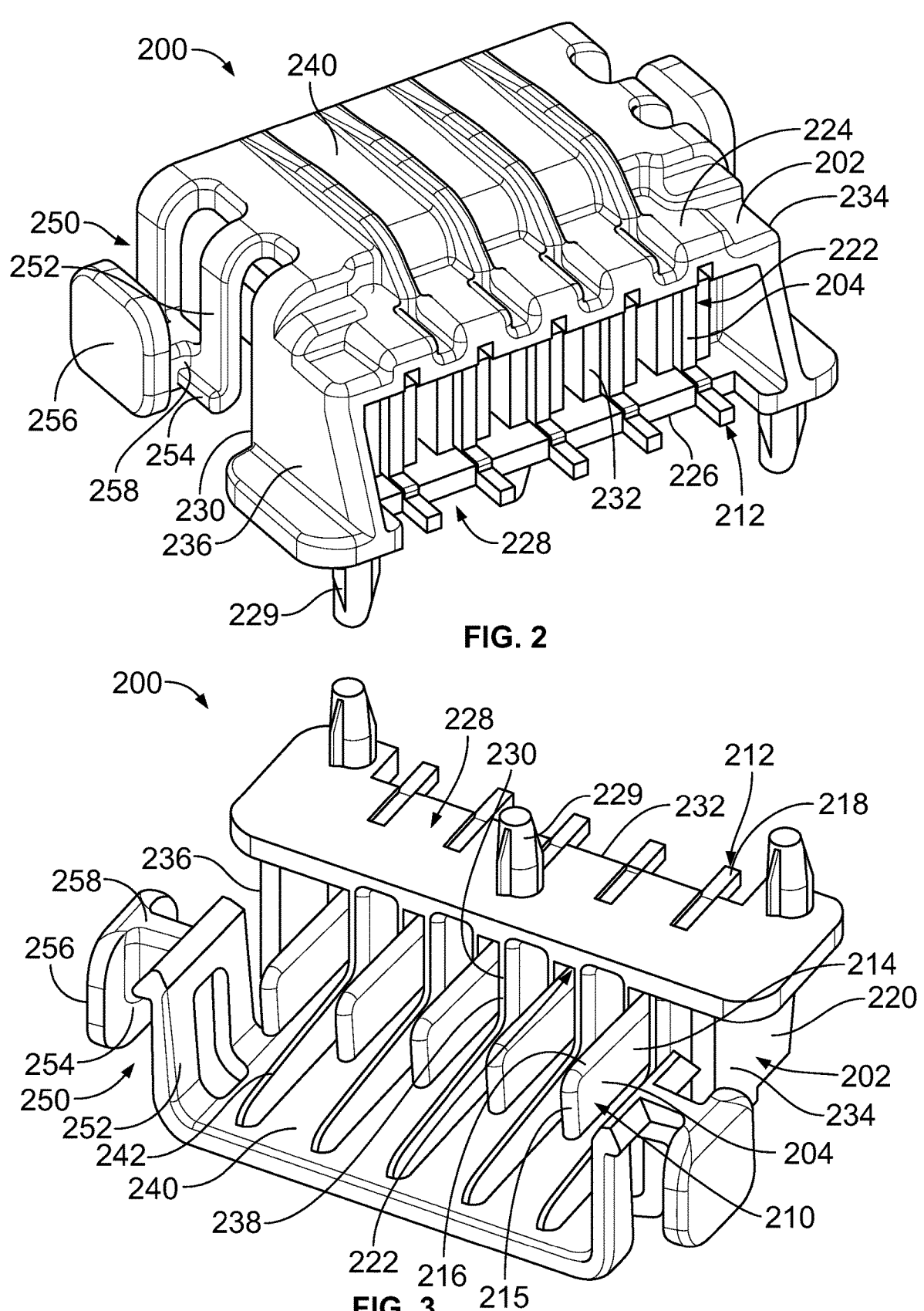
FIG. 2 is a top perspective view of the plug connector in accordance with an exemplary embodiment.
FIG. 3 is a bottom perspective view of the plug connector in accordance with an exemplary embodiment.

FIG. 2 is a top perspective view of the plug connector 200 in accordance with an exemplary embodiment. FIG. 3 is a bottom perspective view of the plug connector 200 in accordance with an exemplary embodiment. The plug connector 200 includes the plug housing 202 and the plug contacts 204.

In an exemplary embodiment, the plug connector 200 includes a plurality of the plug contacts 204. The plug contacts 204 are arranged in the plug housing 202 in a row. The plug contacts 204 may be stamped and formed contacts in various embodiments. Each plug contact 204 extends between a mating end 210 and a terminating end 212.

The mating end 210 is configured to be mated with the corresponding receptacle contact 304. In the illustrated embodiment, the mating end 210 includes a tab 214 configured to be plugged into the receptacle contact 304. The tab 214 extends along a longitudinal axis to a distal end 215. The longitudinal axis is oriented horizontally in the illustrated embodiment. The tab 214 extends parallel to the other tabs 214. The distal ends 215 of the each of the tabs 214 may be aligned with each other. In an exemplary embodiment, the tab 214 includes a bottom edge 216. The bottom edge 216 extends to the distal ends 215. The tab 214 is a blade style contact. Other types of contacts may be provided in alternative embodiments, such as pins, sockets, spring beams, and the like for mating with the receptacle contact 304.

The terminating end 212 is configured to be terminated to the LED board 110. In the illustrated embodiment, the terminating end 212 includes a tail 218. The tail 218 may be a solder tail configured to be soldered to the contact pad 122 of the LED board 110. In the illustrated embodiment, the solder tail is bent or oriented horizontally to extend along the upper surface of the LED board 110. In alternative embodiments, the tail 218 may be oriented vertically and configured to be plugged into a via in the LED board 110. In various embodiments, the terminating ends 212 may include a compliant pin, such as an eye of the needle pin configured to be press-fit into a plated via of the LED board 110.

The plug housing 202 includes a main body 220 holding the plug contacts 204. The main body 220 is manufactured from a dielectric material, such as plastic. The main body 220 may be a molded part. In an exemplary embodiment, the plug housing 202 includes plug contact channels 222 extending through the main body 220. Each plug contact channel 222 holds the corresponding plug contact 204. The main body 220 of the plug housing 202 extends between a top 224 and a bottom 226. The main body 220 of the plug housing 202 extends between a front 230 and a rear 232. The main body 220 of the plug housing 202 extends between a first side 234 and a second side 236.

The main body 220 of the plug housing 202 includes an end wall 238 between the first and second sides 234, 236. The plug contact channels 222 pass through the end wall 238. The plug contact channels 222 are located between the first and second sides 234, 236. The plug contact channels 222 extend between the front 230 and the rear 232 of the main body 220. In various embodiments, the plug contacts 204 may be front loaded into the plug contact channels 222 through the front 230. The terminating ends 212 may extend forward from the end wall 238. The mating ends 210 may extend rearward from the end wall 238.

The plug housing 202 includes a mounting base 228 at the bottom 226 configured to be mounted to the LED board 110. In an exemplary embodiment, the plug housing 202 includes mounting pins 229 extending from the mounting base 228 at the bottom 226. The mounting pins 229 are configured to be press-fit into openings in the LED board 110 to mount the plug housing 202 to the LED board 110. For example, the mounting pins 229 may include crush ribs extending along the sides of the mounting pins 229. Other types of mounting features may be provided in alternative embodiments, such as latches, clips, solder tabs, and the like to secure the plug housing 202 to the LED board 110.

In an exemplary embodiment, the plug housing 202 includes a cover 240 at the rear 232. In the illustrated embodiment, the cover 240 is provided at the top 224. The cover 240 extends rearward from the end wall 238. The cover 240 covers the mating ends 210 of the plug contacts 204, such as extending above the mating ends 210. In an exemplary embodiment, the cover 240 extends beyond the distal ends 215 of the sockets 314. The cover 240 may form a hood that surrounds or shields the plug contacts 204. The cover 240 prevents damage to the plug contacts 204, such as from inadvertent touching of the sockets 314, such as during shipping, handling, assembly, mating, and the like.

In an exemplary embodiment, the cover 240 includes stuffer ribs 242 extending along the bottom side of the cover 240. The stuffer ribs 242 are aligned with the plug contacts 204. The stuffer ribs 242 are configured to be received in the receptacle housing 302 of the receptacle connector 300, such as to guide mating of the plug connector 200 with the receptacle connector 300. In the illustrated embodiment, the stuffer ribs 242 are ramps being narrower at the rear edge of the cover 240.

In an exemplary embodiment, the plug housing 202 includes one or more latches 250 used to latchably couple the plug connector 200 to the receptacle connector 300. In the illustrated embodiment, the latches 250 extend from the cover 240, such as from opposite sides of the cover 240. Each latch 250 includes a deflectable latch arm 252 and a latching beam 254 extending from the latch arm 252. The latching beam 254 is configured to be latchably coupled to the receptacle connector 300. In the illustrated embodiment, the latching beam 254 extends from the distal ends of the latch arm 252, such as the bottom of the latch arm 252. In an exemplary embodiment, the latch 250 includes a release tab 256 extending from the latch arm 252. The release tab 256 is used to release the latch 250 from the receptacle connector 300. In the illustrated embodiment, a support beam extends between the latch arm 252 and the release tab 256. The support beam 258 extends outward from the latch arm 252 to position the release tab 256 outward of the latch arm 252. In the illustrated embodiment, the support beam 258 is approximately centered between a front and a rear of the latch arm 252. The support beam 258 may be located proximate to a bottom of the latch arm 252. Other locations are possible in alternative embodiments. Other types of securing features may be used in alternative embodiments to secure the plug connector 200 to the receptacle connector 300.

Figures 4, 5, 6:
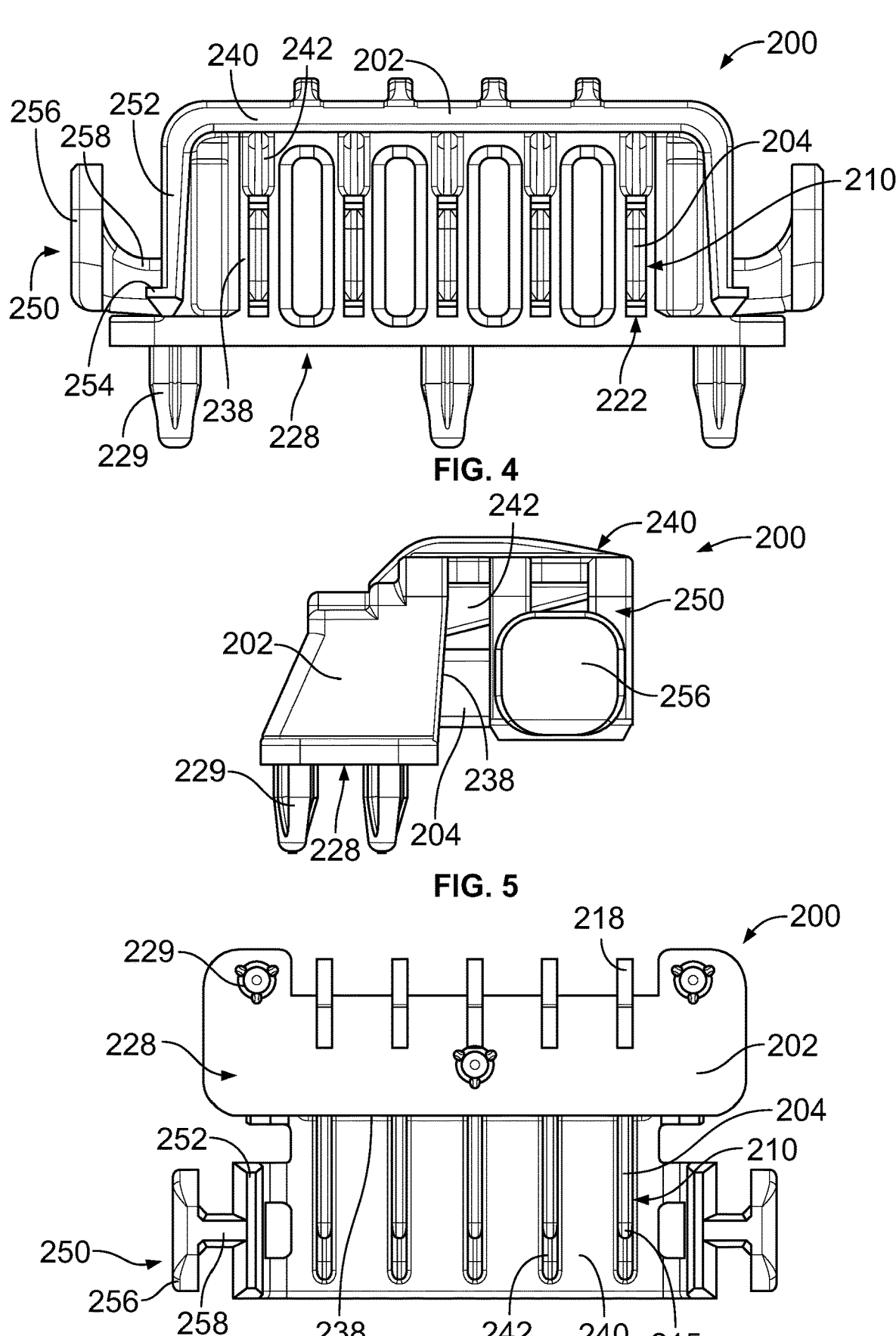
FIG. 4 is a rear view of the plug connector in accordance with an exemplary embodiment.
FIG. 5 is a side view of the plug connector in accordance with an exemplary embodiment.
FIG. 6 is a bottom view of the plug connector in accordance with an exemplary embodiment.

FIG. 4 is a rear view of the plug connector 200 in accordance with an exemplary embodiment. FIG. 5 is a side view of the plug connector 200 in accordance with an exemplary embodiment. FIG. 6 is a bottom view of the plug connector 200 in accordance with an exemplary embodiment. The plug connector 200 includes the plug housing 202 and the plug contacts 204. The plug housing 202 holds the plug contacts 204 for mating with the receptacle connector 300 and for termination to the LED board 110. In an exemplary embodiment, the plug contacts 204 extend parallel to each other between the mating ends 210 and the terminating ends 212 of the plug contacts 204.

The mounting base 228 of the plug housing 202 is configured to be mounted to the LED board 110. The mounting pins 229 extend from the mounting base 228 for connection to the LED board 110. The terminating ends 212 (FIG. 6) extend forward of the mounting base 228 for termination to the LED board 110. Optionally, the bottom sides of the tails 218 may be co-planer with the mounting base 228 for termination to the LED board 110.

The plug contacts 204 are received in the plug contact channels 222 and pass through the end wall 238. The mating ends 210 extend rearward from the end wall 238 and are configured to be plugged into the corresponding receptacle contacts 304 of the receptacle connector 300. The cover 240 extends rearward from the end wall 238 above the mating ends 210 of the plug contacts 204. The cover 240 extends beyond the distal ends 215 of the sockets 314. The stuffer ribs 242 are aligned with the sockets 314. The stuffer ribs 242 extend beyond the distal ends 215 of the sockets 314 such that the stuffer ribs 242 may be plugged into the receptacle connector 300 prior to the plug contacts 204. The stuffer ribs 242 may be used to align the plug connector 200 with the receptacle connector 300 during mating. The cover 240 covers the plug contacts 204 from above. The latches 250 cover the sides of the plug contacts 204.

In the illustrated embodiment, the latches 250 are provided along both sides of the cover 240. The latch beams 254 face outward from the latch arms 252. The support beams 258 extend outward from the latch arms 252 to position the release tabs 256 outward of the latch arms 252. The release tabs 256 may be squeezed or pressed inward to release the latches 250 from the receptacle connector 300.

Figures 7, 8:
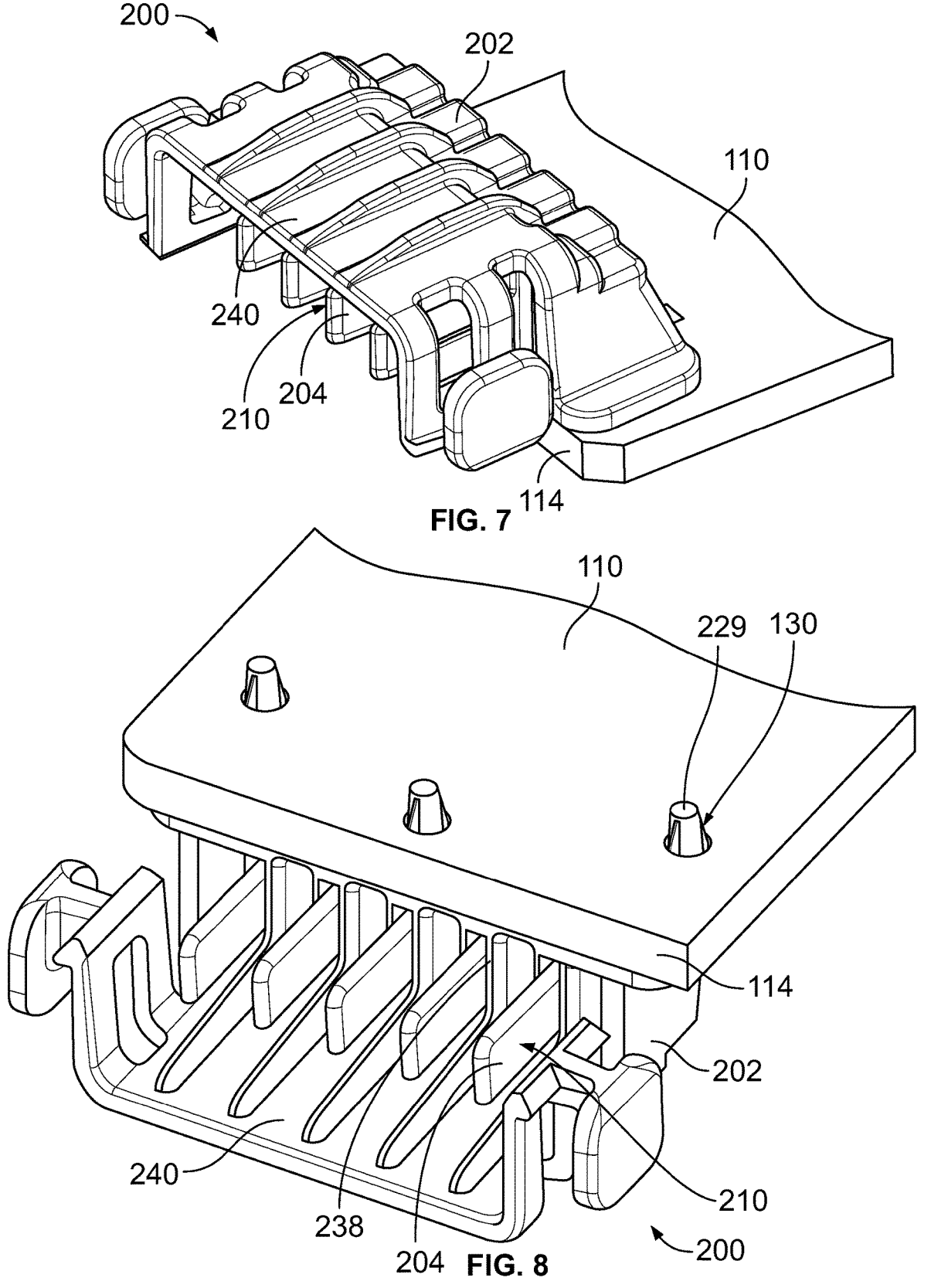
FIG. 7 is a top perspective view of the plug connector mounted to the LED board in accordance with an exemplary embodiment.
FIG. 8 is a bottom perspective view of the plug connector mounted to the LED board in accordance with an exemplary embodiment.
Figure 9:
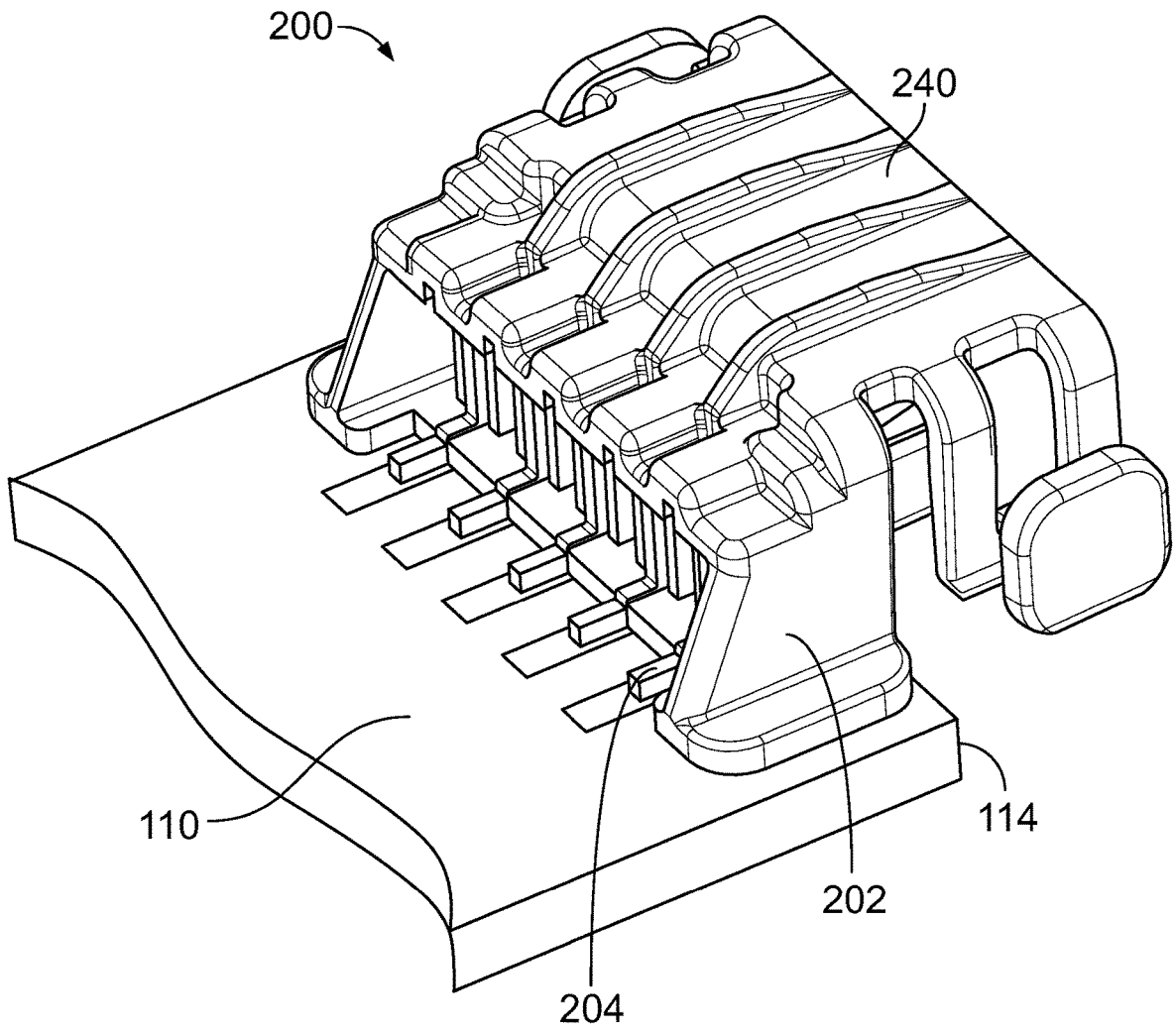
FIG. 9 is a front perspective view of the plug connector mounted to the LED board in accordance with an exemplary embodiment.

FIG. 7 is a top perspective view of the plug connector 200 mounted to the LED board 110 in accordance with an exemplary embodiment. FIG. 8 is a bottom perspective view of the plug connector 200 mounted to the LED board 110 in accordance with an exemplary embodiment. FIG. 9 is a front perspective view of the plug connector 200 mounted to the LED board 110 in accordance with an exemplary embodiment.

In an exemplary embodiment, the LED board 110 includes openings 130 that receive the mounting pins 229. The mounting pins 229 may be press-fit into the openings 130 to secure the plug housing 202 to the LED board 110. The plug connector 200 is mounted to the LED board 110 at the rear end 114. In an exemplary embodiment, a portion of the plug connector 200 extends rearward of the LED board 110. For example, the end wall 238 may be generally aligned with the rear edge of the LED board 110. However, the mating ends 210 of the plug contacts 204 and the cover 240 may extend rearward from the end wall 238, and thus extend rearward of the rear edge of the LED board 110. As such, the mating ends 210 of the plug contacts 204 and the cover 240 are configured to interface with the receptacle connector 300 that is located downstream of the LED board 110.

Figure 10:
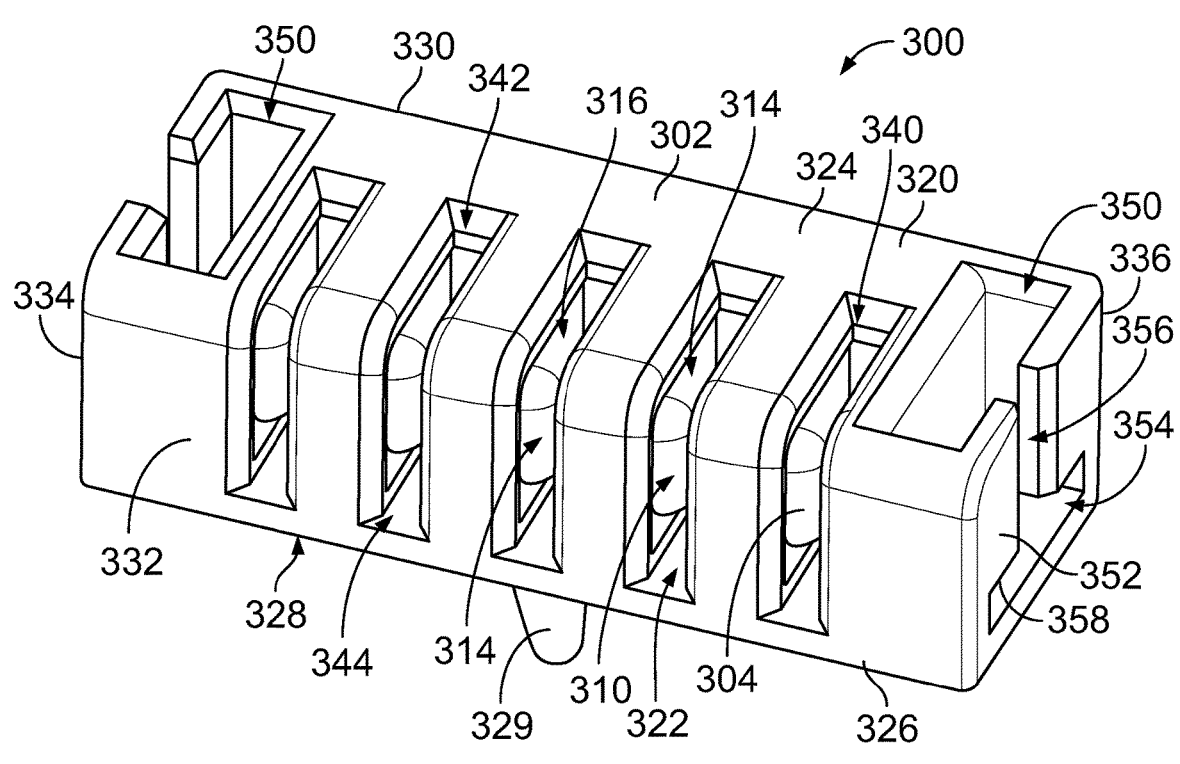
FIG. 10 is a top perspective view of the receptacle connector in accordance with an exemplary embodiment.
Figure 11:
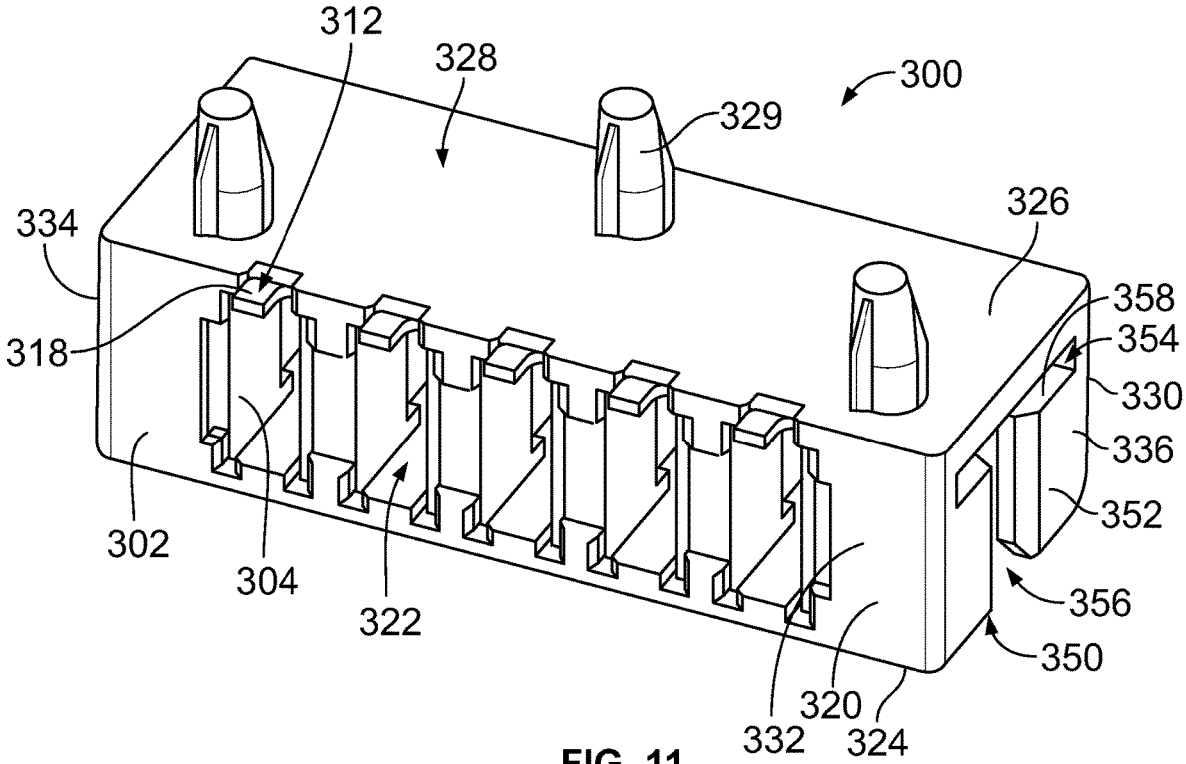
FIG. 11 is a bottom perspective view of the receptacle connector in accordance with an exemplary embodiment.

FIG. 10 is a top perspective view of the receptacle connector 300 in accordance with an exemplary embodiment. FIG. 11 is a bottom perspective view of the receptacle connector 300 in accordance with an exemplary embodiment. The receptacle connector 300 includes the receptacle housing 302 and the receptacle contacts 304.

In an exemplary embodiment, the receptacle connector 300 includes a plurality of the receptacle contacts 304. The receptacle contacts 304 are arranged in the receptacle housing 302 in a row. The receptacle contacts 304 may be stamped and formed contacts in various embodiments. Each receptacle contact 304 extends between a mating end 310 and a terminating end 312.

The mating end 310 is configured to be mated with the corresponding plug contact 204. In the illustrated embodiment, the mating end 310 includes a socket 314 configured to receive the tab 214 of the plug contact 204 (shown in FIG. 2). In an exemplary embodiment, the socket 314 includes a front opening 315 at a distal end and a top opening 316 at a top of the socket 314. The top opening 316 is configured to receive the bottom edge 216 of the tab 214 of the corresponding plug contact 204, such as when the plug connector 200 is plugged into the receptacle connector from above. The socket 314 is open at the front opening 315 to allow the tab 214 to extend forward from the socket 314 when mated thereto. Other types of contacts may be provided in alternative embodiments, such as pins, blades, spring beams, and the like for mating with the plug contact 204.

The terminating end 312 is configured to be terminated to the LED board 110. In the illustrated embodiment, the terminating end 312 includes a tail 318. The tail 318 may be a solder tail configured to be soldered to the contact pad 124 of the LED board 110. In the illustrated embodiment, the solder tail is bent or oriented horizontally to extend along the upper surface of the LED board 110. In alternative embodiments, the tail 318 may be oriented vertically and configured to be plugged into a via in the LED board 110. In various embodiments, the terminating ends 312 may include a compliant pin, such as an eye of the needle pin configured to be press-fit into a plated via of the LED board 110.

The receptacle housing 302 includes a main body 320 holding the receptacle contacts 304. The main body 320 is manufactured from a dielectric material, such as plastic. The main body 320 may be a molded part. In an exemplary embodiment, the receptacle housing 302 includes receptacle contact channels 322 extending through the main body 320. Each receptacle contact channel 322 holds the corresponding receptacle contact 304.

The receptacle housing 302 extends between a top 324 and a bottom 326. The receptacle housing 302 extends between a front 330 and a rear 332. The receptacle housing 302 extends between a first side 334 and a second side 336. In various embodiments, the receptacle contacts 304 may be rear loaded into the receptacle contact channels 322 through the rear 332. The terminating ends 312 may extend rearward from the receptacle housing 302 for termination to the LED board 110. In an exemplary embodiment, the mating ends 310 are encased or enclosed by the receptacle housing 302, such as being surrounded from above, below, forward, rearward and on the sides with limited access to prevent inadvertent connection to or damage to the receptacle contacts 304.

The receptacle housing 302 includes a plurality of slots 340 that are open to the receptacle contact channels 322. The slots 340 are configured to receive the plug contacts 204. The sockets 314 are aligned with the slots 340 to receive the plug contacts 204. In an exemplary embodiment, each slot 340 includes a top opening 342 along the top 324 and a front opening 344 along the front 330. The slot 340 is continuous between the openings 342, 344 to allow loading of the plug contacts 204 into the slots 340.

The receptacle housing 302 includes a mounting base 328 at the bottom 326 configured to be mounted to the LED board 110. In an exemplary embodiment, the receptacle housing 302 includes mounting pins 329 extending from the mounting base 328 at the bottom 326. The mounting pins 329 are configured to be press-fit into openings in the LED board 110 to mount the receptacle housing 302 to the LED board 110. For example, the mounting pins 329 may include crush ribs extending along the sides of the mounting pins 329. Other types of mounting features may be provided in alternative embodiments, such as latches, clips, solder tabs, and the like to secure the receptacle housing 302 to the LED board 110.

In an exemplary embodiment, the receptacle housing 302 includes one or more latch pockets 350 used to latchably couple the plug connector 200 to the receptacle connector 300. In the illustrated embodiment, the latch pockets 350 are provided at the first and second sides 334, 336. The latch pockets 350 are open at the top 324 to receive the latches 250 (shown in FIG. 2) from above during mating. In the illustrated embodiment, each latch pocket 350 includes an outer wall 352 having a latching slot 354 and a loading slot 356 extending to the latching slot 354. The loading slot 356 extends from the top 324 and is open at the top 324 to receive the latch 250. The latching slot 354 is provided near the bottom 326. The latch pocket 350 includes catch surfaces 358 extending along the latching slot 354. The latching slot 354 is configured to receive the latch 250, such as the latching beam 254, and the catch surfaces 358 are configured to retain the latching beam 254 in the latch pocket 350 until the latch 250 is released.

Figures 12, 13, 14:
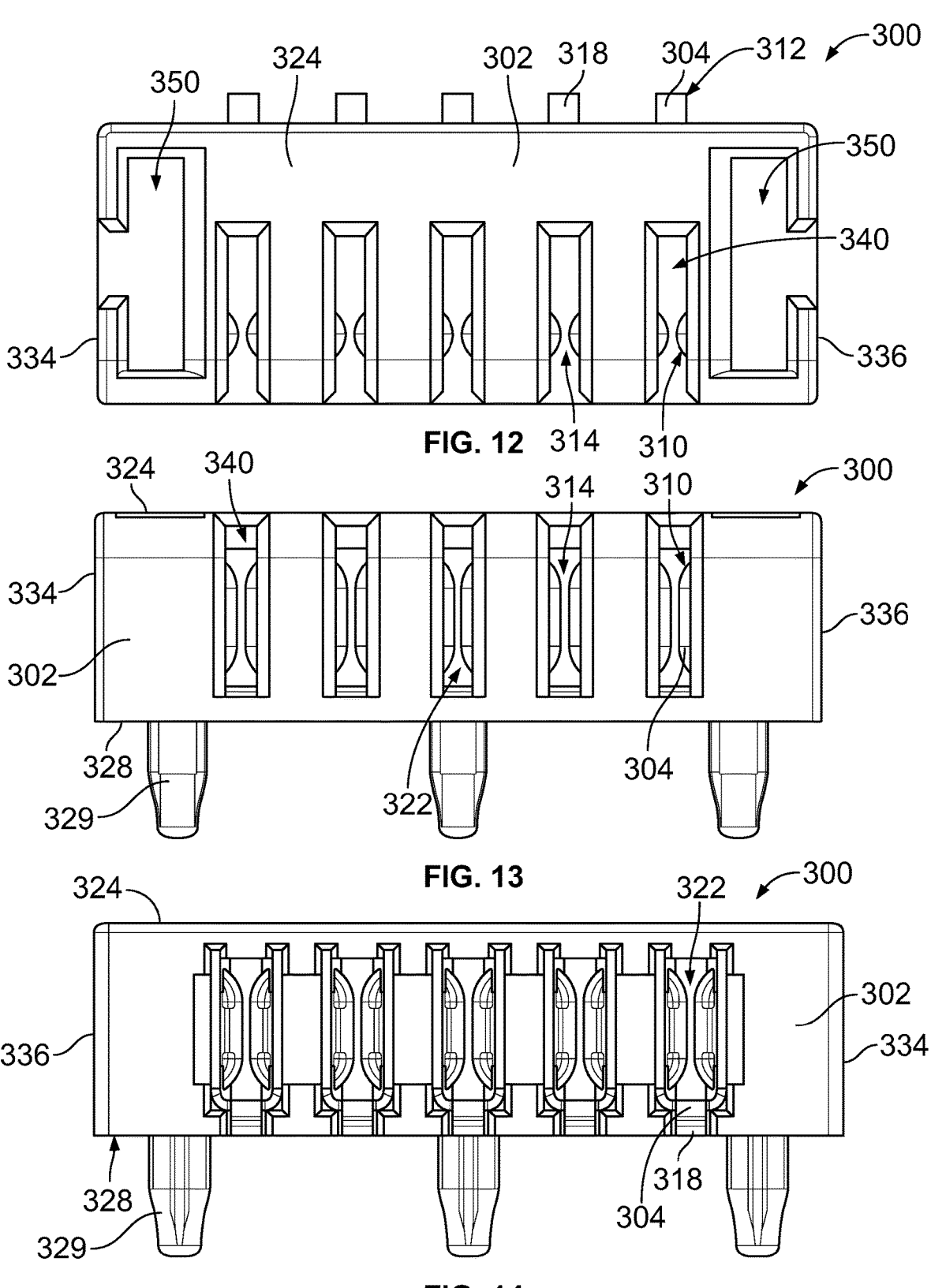
FIG. 12 is a top view of the receptacle connector in accordance with an exemplary embodiment.
FIG. 13 is a front view of the receptacle connector in accordance with an exemplary embodiment.
FIG. 14 is a rear view of the receptacle connector in accordance with an exemplary embodiment.

FIG. 12 is a top view of the receptacle connector 300 in accordance with an exemplary embodiment. FIG. 13 is a front view of the receptacle connector 300 in accordance with an exemplary embodiment. FIG. 14 is a rear view of the receptacle connector 300 in accordance with an exemplary embodiment. The receptacle connector 300 includes the receptacle housing 302 and the receptacle contacts 304. The receptacle housing 302 holds the receptacle contacts 304 for mating with the plug connector 200 and for termination to the LED board 110. In an exemplary embodiment, the receptacle contacts 304 extend parallel to each other between the mating ends 310 and the terminating ends 312 of the receptacle contacts 304.

The mounting base 328 of the receptacle housing 302 is configured to be mounted to the LED board 110. The mounting pins 329 extend from the mounting base 328 for connection to the LED board 110. The terminating ends 312 (FIGS. 12 and 14) extend rearward of the mounting base 328 for termination to the LED board 110. Optionally, the bottom sides of the tails 318 may be co-planer with the mounting base 328 for termination to the LED board 110.

The receptacle contacts 304 are received in the receptacle contact channels 322 and aligned with the slots 340 to receive the plug contacts 204. For example, the sockets 314 at the mating ends 310 are aligned with the slots 340 to receive the plug contacts 204. The sockets 314 have mating interfaces extending into the slots 340 to mate with the plug contacts 204. The mating interfaces may be curved inward. Optionally, the sockets 314 are designed to having mating interfaces on both sides of the slots 340 to interface with both sides of the plug contacts 204.

In the illustrated embodiment, the latch pockets 350 are provided along both sides 334, 336 of the receptacle housing 302. The latch pockets 350 may be in line with the slots 340, such as flanking both sides of the array of receptacle contacts 304. The latch pockets 350 are open at the top 324 to receive the latches 250.

Figure 15:
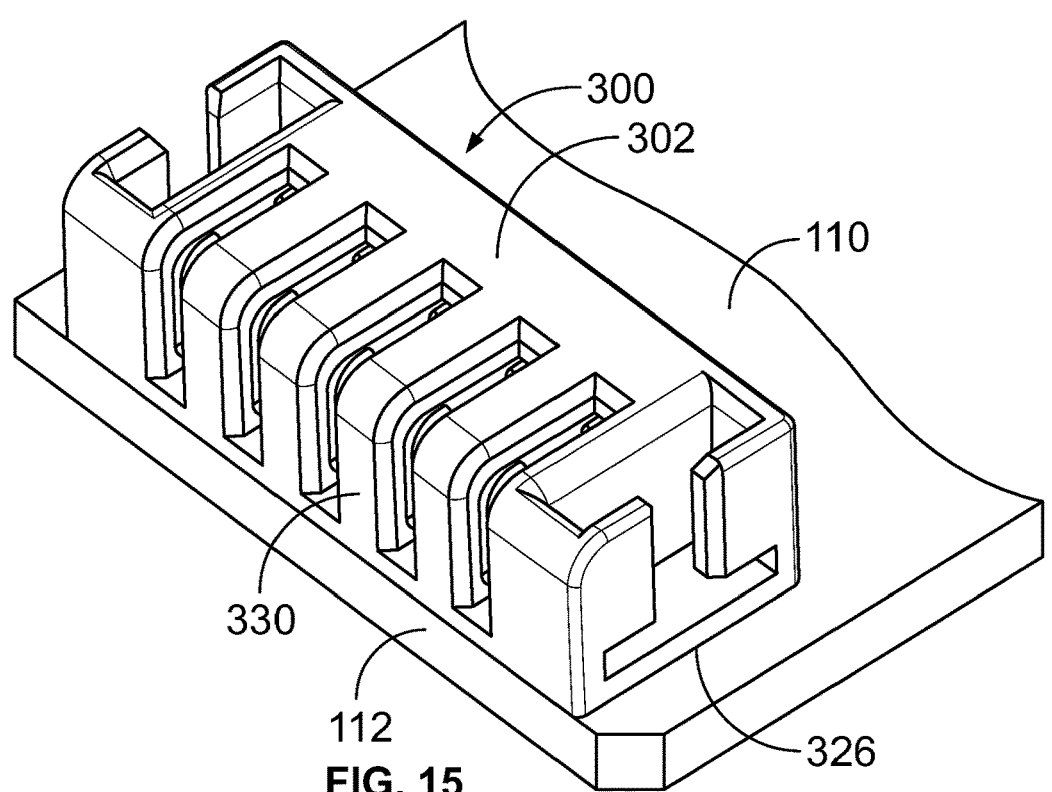
FIG. 15 is a front perspective view of the receptacle connector mounted to the LED board in accordance with an exemplary embodiment.
Figure 16:
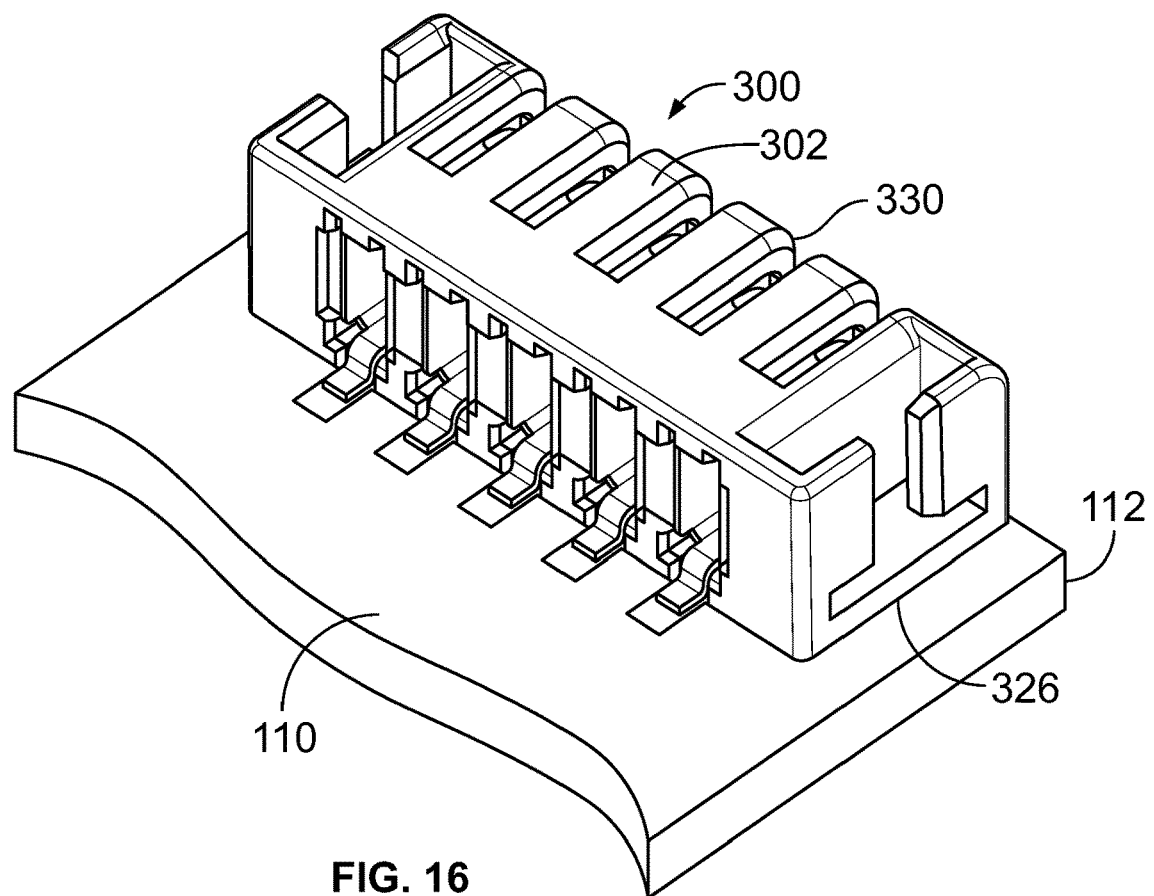
FIG. 16 is a rear perspective view of the receptacle connector mounted to the LED board in accordance with an exemplary embodiment.

FIG. 15 is a front perspective view of the receptacle connector 300 mounted to the LED board 110 in accordance with an exemplary embodiment. FIG. 16 is a rear perspective view of the receptacle connector 300 mounted to the LED board 110 in accordance with an exemplary embodiment.

In an exemplary embodiment, the LED board 110 includes openings (not shown) that receive the mounting pins extending from the bottom 326 of the receptacle housing 302. The mounting pins may be press-fit into the openings to secure the receptacle housing 302 to the LED board 110. The receptacle connector 300 is mounted to the LED board 110 at the front end 112. Optionally, the front 330 of the receptacle housing 302 may be generally aligned with or flush with the front edge of the LED board 110 at the front end 112. However, the front 330 may be slightly recessed or may protrude slightly forward of the front edge of the LED board 110 in alternative embodiments for mating with the plug connector 200.

Figures 17, 18:
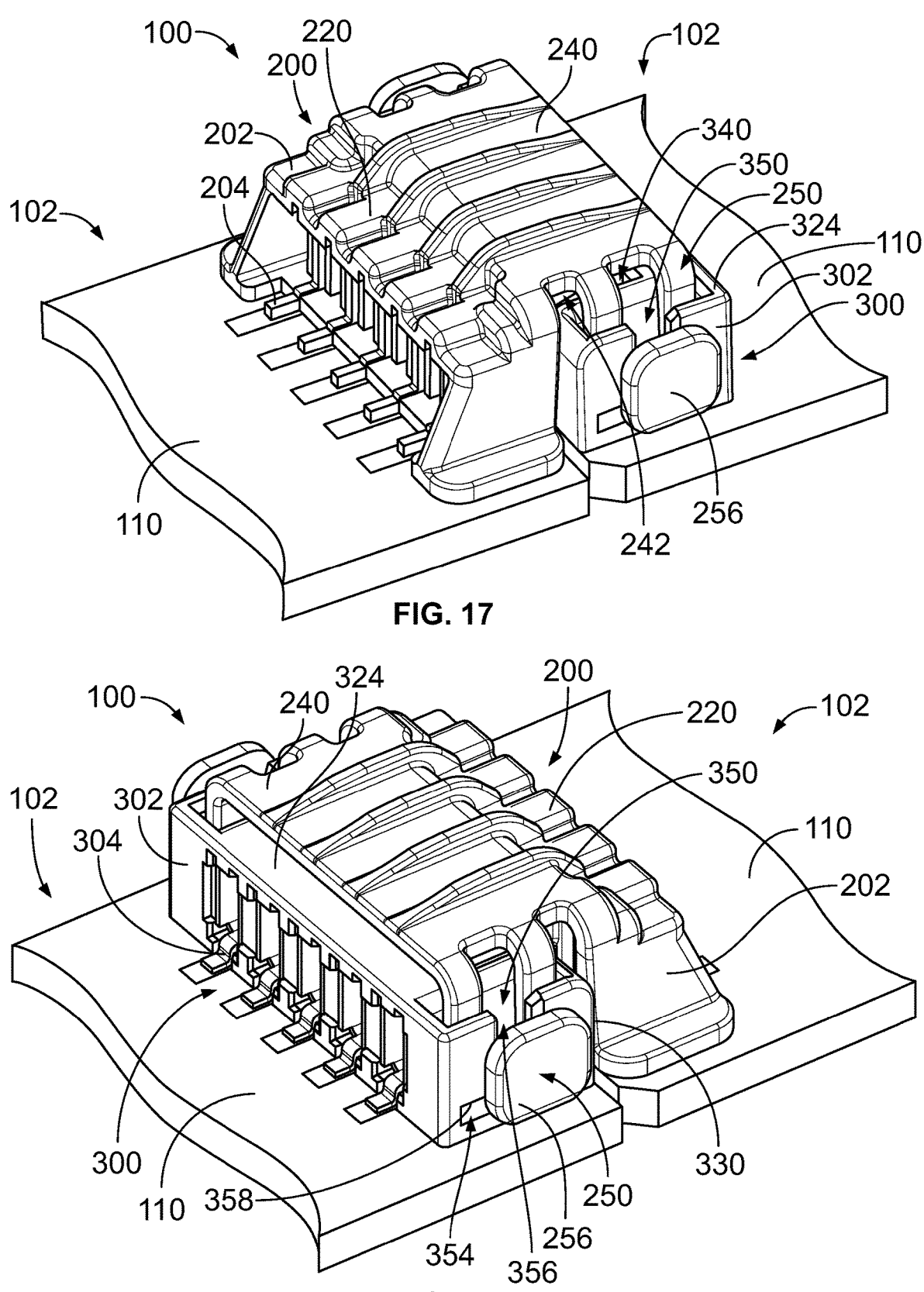
FIG. 17 is a front perspective view of a portion of the lighting system showing the first plug connector of the first LED assembly connected to the second receptacle connector of the second LED assembly in accordance with an exemplary embodiment.
FIG. 18 is a rear perspective view of a portion of the lighting system showing the second receptacle connector of the second LED assembly connected to the third plug connector of the third LED assembly in accordance with an exemplary embodiment.

FIG. 17 is a front perspective view of a portion of the lighting system 100 showing the first plug connector 200 of the first LED assembly 102a connected to the second receptacle connector 300 of the second LED assembly 102b in accordance with an exemplary embodiment. FIG. 18 is a rear perspective view of a portion of the lighting system 100 showing the second receptacle connector 300 of the second LED assembly 102b connected to the third plug connector 200 of the third LED assembly 102c in accordance with an exemplary embodiment. The LED boards 110 of the LED assemblies 102 are arranged end to end in a strip. The LED boards 110 are electrically connected by the plug connectors 200 and the receptacle connectors 300. Power is jumped across the thresholds between the LED boards 110 through the connectors 200, 300.

During mating, the plug connector 200 is mated to the receptacle connector 300 from above. For example, the plug contacts 204 are loaded into the slots 340 through the top openings 342. The tabs 214 at the mating ends 210 of the plug contacts 204 are loaded into the sockets 314 from above to plug the tabs 214 into the sockets 314. When mated, the tabs 214 extend forward from the receptacle connector 300, such as through the front openings 344 of the slots 340.

When mated, the end wall 238 of the plug housing 202 is located forward of the front 330 of the receptacle housing 302. The plug contacts 204 extend across the threshold between the LED assemblies 102. In an exemplary embodiment, the cover 240 extends across the threshold between the LED assemblies 102. The cover 240 extends rearward from the main body 220 of the plug housing 202 and covers the top 324 of the receptacle housing 302. The cover 240 covers the slots 340, such as to prevent dirt or debris from entering the slots 340 and/or to prevent inadvertent touching of the contacts 204, 304. In an exemplary embodiment, the stuffer ribs 242 along the bottom surface of the cover 240 are received in the slots 340. The stuffer ribs 242 may guide mating of the plug connector 200 with the receptacle connector 300. For example, when the stuffer ribs 242 are received in the slots, the tabs 214 may be aligned with the sockets 314 for mating the plug contacts 204 with the receptacle contacts 304.

During mating, the latches 250 are loaded into the latch pockets 350 through the top 324. The support beam 258 is received in the loading slot 356 as the latch 250 is plugged into the latch pocket 350. When mated, the latching beam 254 is received in the latching slot 354 and engages the catching surface 358 to latchably couple the plug connector 200 to the receptacle connector 300. The latch 250 is unable to be removed from the latch pocket 350 with the latching beam 254 engages the catching surface 358. However, the latch 250 may be released by pressing the release tab 256 inward whereby the plug connector 200 may be lifted upward to separate the plug connector 200 from the receptacle connector 300.

It is understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An LED assembly comprising:

an LED board extending between a front end and a rear end, the LED board having an LED element on the LED board;

a receptacle connector mounted to the LED board at the front end, the receptacle connector including a receptacle housing holding receptacle contacts configured to be mated with mating plug contacts of a mating plug connector on another LED board, the receptacle housing having a bottom mounted to the LED board and a top opposite the bottom, the receptacle housing having a front and a rear opposite the front, the receptacle housing having a first side and a second side, the receptacle housing having receptacle contact channels therethrough that receive the corresponding receptacle contacts, the receptacle housing including contact slots associated with each of the receptacle contact channels, the contact slots having top openings at the top, the contact slots having front openings at the front, wherein the top openings are configured to receive the mating plug contacts from above during mating to mate with the receptacle contacts and wherein the front openings allow the mating plug contacts to extend from the front of the receptacle housing; and a plug connector mounted to the LED board at the rear end, the plug connector including a plug housing holding plug contacts configured to be mated with mating receptacle contacts of a mating receptacle connector on another LED board, the plug housing having a bottom mounted to the LED board and a top opposite the bottom, the plug housing having a front and a rear opposite the front, the front of the plug housing extending beyond the rear end of the LED board such that the plug connector is cantilevered from the LED board, the plug housing having a first side and a second side, the plug housing having plug contact channels therethrough that receive the corresponding plug contacts, the plug housing including an end wall, the plug contacts having mating ends extending forward of the end wall, the mating ends of the plug contacts located beyond the rear end of the LED board, the mating ends configured to be plugged into the mating receptacle contacts of the mating receptacle connector.

2. The LED assembly of claim 1, wherein the receptacle connector is configured to be identical to the mating receptacle connector and the plug connector is configured to be identical to the mating plug connector.

3. The LED assembly of claim 1, wherein the plug connector is configured to be mated to the mating receptacle connector and the receptacle connector is configured to be mated with the mating plug connector such that the LED board is co-planer with and arranged in line with the other LED boards.

4. The LED assembly of claim 1, wherein the receptacle connector is generally aligned with an edge of the LED board at the front end to mate with the mating plug connector, the plug connector extending rearward of the rear end of the LED board to mate with the mating receptacle connector.

5. The LED assembly of claim 1, wherein the plug connector includes a cover extending rearward from the end wall and covering the mating ends of the plug contacts, the cover configured to extend along the mating receptacle connector to cover the mating receptacle connector when the plug connector is mated thereto.

6. The LED assembly of claim 5, wherein the cover includes stuffer ribs extending along the cover aligned with each of the plug contacts, the stuffer ribs are configured to be loaded in slots in the mating receptacle connector.

7. The LED assembly of claim 5, wherein the cover is configured to be latchably coupled to the mating receptacle connector.

8. The LED assembly of claim 1, wherein the plug connector includes a latch having a latching beam configured to be latchably coupled to the mating receptacle connector.

9. The LED assembly of claim 1, wherein the receptacle connector includes a latch pocket at the first side, the latch pocket configured to receive a latch of the mating plug connector to latchably couple the receptacle connector to the mating plug connector.

10. The LED assembly of claim 1, wherein the receptacle contacts include sockets at mating ends of the receptacle contacts, the sockets being aligned with the slots, the sockets being configured to receive the mating plug contacts from above.

11. The LED assembly of claim 1, wherein the receptacle contacts include solder tabs at terminating ends of the receptacle contacts, the solder tabs being soldered to contact pads on the LED board.

12. The LED assembly of claim 1, wherein the receptacle connector includes mounting pins extending from the bottom, the mounting pins being press-fit into openings in the LED board to mount the receptacle connector to the LED board.

13. The LED assembly of claim 1, wherein the plug connector includes mounting pins extending from the bottom, the mounting pins being press-fit into openings in the LED board to mount the plug connector to the LED board.

14. The LED assembly of claim 1, wherein the plug contacts include solder tabs at terminating ends of the plug contacts, the solder tabs being soldered to contact pads on the LED board.

15. A lighting system comprising:

a plurality of LED assemblies electrically connected in series, each LED assembly comprising:

an LED board extending between a front end and a rear end, the LED board having an LED element on the LED board;

a receptacle connector mounted to the LED board at the front end, the receptacle connector including a receptacle housing holding receptacle contacts, the receptacle housing having a bottom mounted to the LED board and a top opposite the bottom, the receptacle housing having a front and a rear opposite the front, the receptacle housing having a first side and a second side, the receptacle housing having receptacle contact channels therethrough that receive the corresponding receptacle contacts, the receptacle housing including contact slots associated with each of the receptacle contact channels, the contact slots having top openings at the top, the contact slots having front openings at the front; and a plug connector mounted to the LED board at the rear end, the plug connector including a plug housing holding plug contacts, the plug housing having a bottom mounted to the LED board and a top opposite the bottom, the plug housing having a front and a rear opposite the front, the front of the plug housing extending beyond the rear end of the LED board such that the plug connector is cantilevered from the LED board, the plug housing having a first side and a second side, the plug housing having plug contact channels therethrough that receive the corresponding plug contacts, the plug housing including an end wall, the plug contacts having mating ends extending forward of the end wall, the mating ends of the plug contacts located beyond the rear end of the LED board;

wherein the plurality of LED assemblies includes a first LED assembly, a second LED assembly, and a third LED assembly, wherein the second LED assembly is positioned between the first LED assembly and the second LED assembly;

wherein the plug connector of the first LED assembly is configured to be coupled to the receptacle connector of the second LED assembly by loading the mating ends of the plug contacts of the first LED assembly into the top openings of the receptacle housing of the second LED assembly to mate with the receptacle contacts of the second LED assembly, when mated, the plug contacts extend from the end wall of the plug housing of the first LED assembly into the front openings of the receptacle housing of the second LED assembly to electrically connect with the receptacle contacts of the second LED assembly; and wherein the plug connector of the second LED assembly is configured to be coupled to the receptacle connector of the third LED assembly by loading the mating ends of the plug contacts of the second LED assembly into the top openings of the receptacle housing of the third LED assembly to mate with the receptacle contacts of the third LED assembly, when mated, the plug contacts extend from the end wall of the plug housing of the second LED assembly into the front openings of the receptacle housing of the third LED assembly to electrically connect with the receptacle contacts of the third LED assembly.

16. The lighting system of claim 15, wherein the receptacle connectors of each of the LED assemblies are identical to each other and wherein the plug connectors of each of the LED assemblies are identical to each other.

17. The lighting system of claim 15, wherein the LED boards of each of the LED assembles are coplanar and arranged end to end.

18. The lighting system of claim 15, wherein the LED boards of the LED assemblies are arranged end to end at thresholds, each plug connector extending across the corresponding threshold to mate with the corresponding receptacle connector.

19. The lighting system of claim 15, wherein the plug connector includes a cover extending rearward from the end wall and covering the mating ends of the plug contacts, the cover configured to extend along the corresponding receptacle connector to cover the slots in the corresponding receptacle connector when the plug connector is mated thereto.

20. The lighting system of claim 15, wherein the plug connector includes a latch having a latching beam at the first side of the plug housing, the receptacle connector including a latch pocket at the first side of the receptacle housing, the latch pocket receives the latch of the corresponding plug connector to latchably couple the receptacle connector to the corresponding plug connector.

* * * * *